United States Patent
Im et al.

(10) Patent No.: US 9,484,931 B2
(45) Date of Patent: Nov. 1, 2016

(54) DELAY LOCKED LOOP CIRCUIT AND OPERATION METHOD THEREOF

(71) Applicant: SK hynix Inc., Gyeonggi-do (KR)

(72) Inventors: Da-In Im, Gyeonggi-do (KR); Young-Suk Seo, Gyeonggi-do (KR)

(73) Assignee: SK Hynix Inc., Gyeonngi-do (KR)

( * ) Notice: Subject to any disclaimer, the term of this patent is extended or adjusted under 35 U.S.C. 154(b) by 0 days.

(21) Appl. No.: 14/678,683

(22) Filed: Apr. 3, 2015

(65) Prior Publication Data
US 2016/0142060 A1    May 19, 2016

(30) Foreign Application Priority Data
Nov. 14, 2014 (KR) .................. 10-2014-0158692

(51) Int. Cl.
| | |
|---|---|
| *H03L 7/06* | (2006.01) |
| *H03L 7/08* | (2006.01) |
| *H03K 5/14* | (2014.01) |
| *H03K 3/017* | (2006.01) |
| *H03K 5/00* | (2006.01) |

(52) U.S. Cl.
CPC ................ *H03L 7/08* (2013.01); *H03K 3/017* (2013.01); *H03K 5/14* (2013.01); *H03K 2005/00019* (2013.01)

(58) Field of Classification Search
CPC ... H03L 7/0814; H03L 7/0812; H03L 7/087; H03L 2207/02; G11C 7/22
USPC .................. 327/149, 153, 158, 161
See application file for complete search history.

(56) References Cited

U.S. PATENT DOCUMENTS

| | | | | |
|---|---|---|---|---|
| 6,310,822 B1 * | 10/2001 | Shen | ....................... | G06F 1/10 327/294 |
| 6,437,619 B2 * | 8/2002 | Okuda | ................. | G11C 7/1051 327/156 |
| 8,390,351 B2 * | 3/2013 | Choi | .................... | G11C 7/1072 327/149 |

FOREIGN PATENT DOCUMENTS

| | | |
|---|---|---|
| KR | 100422572 | 3/2004 |
| KR | 1020040100249 | 12/2004 |

* cited by examiner

*Primary Examiner* — Lincoln Donovan
*Assistant Examiner* — Diana J Cheng
(74) *Attorney, Agent, or Firm* — IP & T Group LLP

(57) ABSTRACT

A delay locked loop (DLL) circuit may include: an input clock control unit suitable for transmitting first and second internal clocks generated based on an external clock, and controlling transmission of the second internal clock based on a clock control signal which is activated during a predetermined period; a clock delay unit suitable for generating a first delay locked clock by delaying the first internal clock by a delay time required for locking, and generating a second delay locked clock by delaying the second internal clock based on the clock control signal; and an output clock control unit suitable for outputting the first delay locked clock and the second delay locked clock during a period in which the clock control signal is activated.

10 Claims, 5 Drawing Sheets

DELAY LOCKED LOOP CIRCUIT AND OPERATION METHOD THEREOF

CROSS-REFERENCE TO RELATED APPLICATIONS

The present application claims priority of Korean Patent Application No. 10-2014-0158692, filed on Nov. 14, 2014, which is incorporated herein by reference in its entirety.

BACKGROUND

1. Field

Various embodiments of the present invention relate to a semiconductor design technology, and more particularly, to a delay locked loop (DLL) circuit.

2. Description of the Related Art

In a system or circuit, a clock is used as a reference signal for adjusting operation timing, and helps to assure high-speed operation without errors. When an external clock is inputted to be used in the system or circuit, there may be clock skew caused by time delays in one of the internal circuits. A delayed locked loop (DLL) is used to correct time delays so the internal clocks are synchronized with the external clocks.

FIG. 1 is a diagram illustrating a conventional DLL circuit.

Referring to FIG. 1, the conventional DLL circuit includes a clock dividing unit 110, a delay line unit 120, a replica delay unit 130, a phase comparison unit 140, and a delay control unit 150.

The clock dividing unit 110 receives external differential clocks CLK and CLKB, and generates a first internal lock ICLK and a second internal clock QCLK by dividing the received external differential clocks CLK and CLKB. The external clock CLKB is complementary to the external clock CLK, and thus the second internal clock QCLK has a phase difference of 180 degrees from the first internal clock ICLK.

The delay line unit 120 delays the first and second internal clocks ICLK and QCLK according to a delay control signal CTRL, and outputs the delayed signals as first and second delay locked clocks DLLCLKI and DLLCLKQ.

The replica delay unit 130 reflects an actual delay of a clock path and a data path into the first delay locked clock DLLCLKI outputted from the delay line unit 120, to output a feedback clock FBCLK. The feedback clock FBCLK is obtained by adding a delay time of the delay line unit 120 and a delay time of the replica delay unit 130 to the first internal clock ICLK.

The phase comparison unit 140 compares a phase of the external clock CLK to a phase of the feedback clock FBCLK to output a comparison result UP/DN.

The delay control unit 150 generates the delay control signal CTRL based on the comparison result UP/DN outputted from the phase comparison unit 140.

While repeating such a series of loop operations, the DLL circuit continuously compares the first internal clock ICLK to the feedback clock FBCLK, and outputs the desired first delay locked clock DLLCLKI when the two clocks have a minimum jitter (i.e., when the first delay locked clock DLLCLKI is locked). The delay control unit 150 performs an update operation at each predetermined period after locking. During the update operation, jitter may occur in the first and second delay locked clocks DLLCLKI and DLLCLKQ, which were previously locked, due to noise or the like. Thus, to compensate for the jitter, the locking process is repetitively performed. The first and second delay locked clocks DLLCLKI and DLLCLKQ, which are eventually outputted, may be generated by delaying the external clock CLK. As such, the first and second delay locked clocks DLLCLKI and DLLCLKQ, which are eventually outputted, may be used during a data output operation for outputting data. The first internal clock ICLK is used during an update operation of the DLL circuit. The second internal clock QCLK is not used during the update operation of the DLL circuit, but the second delay locked clock DLLCLKQ obtained by using the second internal clock QCLK is used during a data output operation.

The conventional DLL circuit continuously generates the first and second delay locked clocks DLLCLKI and DLLCLKQ by repeating the locking operation even when a delay locked clock is not used. Thus, the conventional DLL circuit causes unnecessary current consumption.

SUMMARY

Various embodiments are directed to a delay locked loop (DLL) circuit which is capable of reducing unnecessary current consumption.

In an embodiment, a DLL circuit may include: an input clock control unit suitable for transmitting first and second internal clocks generated based on an external clock, and controlling transmission of the second internal clock based on a clock control signal which is activated during a predetermined period; a clock delay unit suitable for generating a first delay locked clock by delaying the first internal clock by a delay time required for locking, and generating a second delay locked clock by delaying the second internal clock based on the clock control signal; and an output clock control unit suitable for outputting the first delay locked clock and the second delay locked clock during a period in which the clock control signal is activated.

The DLL circuit may further include a clock control signal generation unit suitable for generating the clock control signal, which is activated during a duty cycle correction (DCC) operation period.

The DLL circuit may further include a clock control signal generation unit suitable for generating the clock control signal, which is activated during a normal operation period.

The normal operation period may include an on-die terminal operation, a write operation, or a read operation.

The clock delay unit may include: a delay line unit suitable for generating the first and second delay locked clocks by delaying the first and second internal clocks by the delay time according to a delay control signal; a replica delay unit suitable for generating a feedback clock by delaying the first delay locked clock by a modeled delay amount for an internal path; a phase comparison unit suitable for comparing the phase of the feedback clock to the phase of the external clock; and a delay control unit suitable for generating the delay control signal according to a comparison result of the phase comparison unit.

The DLL circuit may further include a clock dividing unit suitable for generating the first and second internal clocks by dividing the external clock.

In an embodiment, a operating method of a DLL circuit may include: generating a first delay locked clock by delaying a first internal clock by a delay time required for synchronizing the phase of the first internal clock with the phase of a feedback clock, and generating a second delay locked clock by delaying a second internal clock by the delay time during a DCC operation period and a normal operation period; and outputting the first and second delay locked clocks based on a clock control signal which is activated during the DCC operation period and the normal operation period.

The operating method may further include generating first and second internal clocks by dividing an external clock.

The normal operation period may include an on-die termination operation, a write operation, or a read operation.

In an embodiment, a DLL circuit may include: a clock delay unit suitable for receiving an external clock to generate an internal clock, and generating a delay locked clock by delaying the internal clock; a clock control signal generation unit suitable for generating a clock control signal for controlling operation of the clock delay unit during a predetermined period; and an output clock control unit suitable for outputting the delay locked clock based on the clock control signal.

The clock control signal may be activated during a DCC operation period.

The clock control signal may activated during a normal operation period.

The normal operation period may include an on-die termination operation, a write operation, or a read operation.

The clock delay unit may include: a delay line unit suitable for generating the delay locked clock by delaying the internal clock by the delay time according to a delay control signal; a replica delay unit suitable for generating a feedback clock by delaying the delay locked clock by a modeled delay amount for an internal path; a phase comparison unit suitable for comparing the phase of the feedback clock to the phase of the external clock; and a delay control unit suitable for generating the delay control signal according to a comparison result of the phase comparison unit.

DETAILED DESCRIPTION

Figure 1:
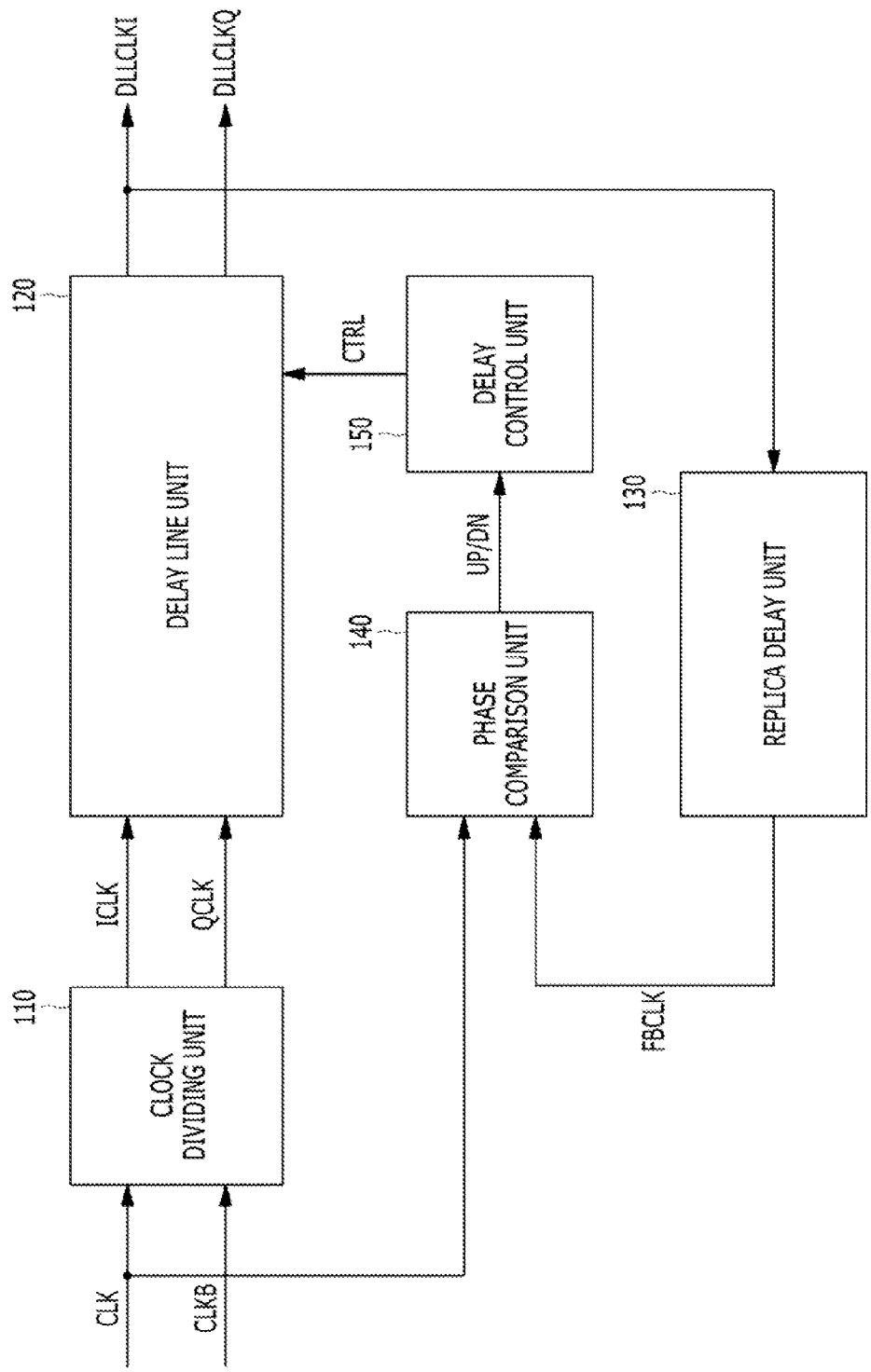
FIG. 1 is a diagram illustrating a conventional delay locked loop (DLL) circuit.

Various embodiments will be described below in more detail with reference to the accompanying drawings. The present Invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

It is also noted that in this specification, "connected/coupled" refers to one component not only directly coupling another component, but also indirectly coupling another component through an intermediate component. In addition, a singular form may include a plural form as long as it is not specifically mentioned. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also where a third layer exists between the first layer and the second layer or the substrate.

Figure 2:
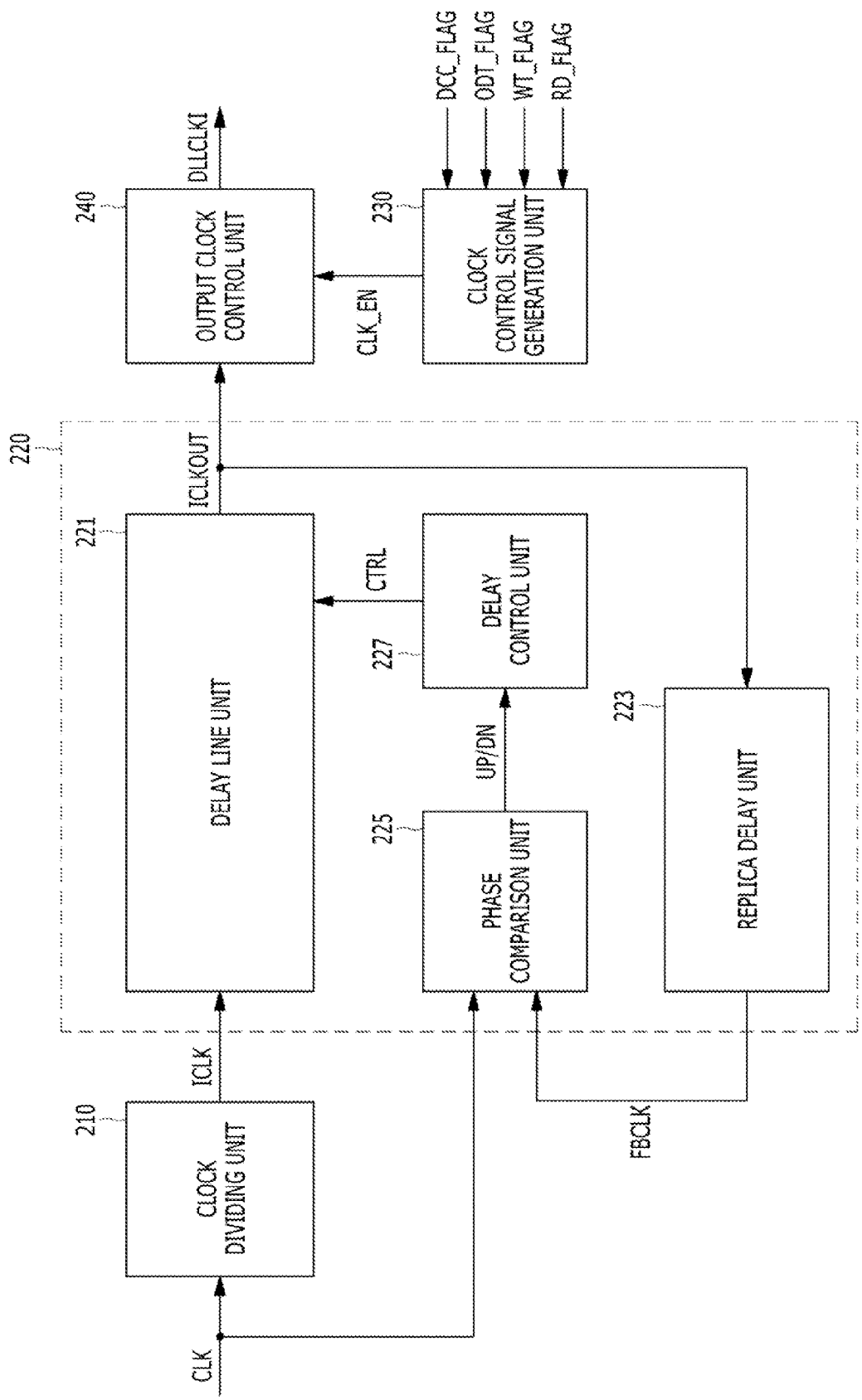
FIG. 2 is a block diagram illustrating a DLL circuit in accordance with an embodiment of the present invention.

FIG. 2 is a block diagram illustrating a delay locked loop (DLL) circuit in accordance with an embodiment of the present invention.

Referring to FIG. 2, the DLL circuit may include a clock dividing unit 210, a clock delay unit 220, a clock control signal generation unit 230, and an output clock control unit 240.

The clock dividing unit 210 may receive an external clock CLK and generate an internal clock ICLK by dividing the received clock.

The clock delay unit 220 may include a delay line unit 221, a replica delay unit 223, a phase comparison unit 225, and a delay control unit 227.

The delay line unit 221 may delay the internal clock ICLK in response to the delay control signal CTRL generated from the delay control unit 227.

The replica delay unit 223 may include a clock obtained by modeling delay elements through which the applied external clock CLK passes before the delay line unit 221 and delay elements through which a delay locked clock ICLK-OUT outputted from the delay line unit 221 passes. The replica delay unit 223 may reflect actual delay components of a clock path and a data path into the delay locked clock ICLKOUT outputted from the delay line unit 221 to output a feedback clock FBCLK. The replica delay unit 223 may output the feedback clock FBCLK to the phase comparison unit 225.

The phase comparison unit 225 may compare the phase of the external clock CLK to the phase of the feedback clock FBCLK, and detect a phase difference between the two clocks.

The delay control unit 227 may generate the delay control signal CTRL having information on a delay amount, according to the comparison result UP/DN from the phase comparison unit 225.

The clock control signal generation unit 230 may generate a clock control signal CLK_EN such that the delay locked clock ICLKOUT outputted from the clock delay unit 220 may be outputted during a specific period. The clock control signal CLK_EN may be activated in response to a duty cycle correction (DCC) information signal DCC_FLAG. The DCC information signal DCC_FLAG may be activated when a DCC operation is intended to be performed, and deactivated when the DCC operation is ended. That is, the DCC information signal DCC_FLAG may indicate a DCC operation period.

The clock control signal generation unit 230 may activate the clock control signal CLK_EN during an on-die termination period, in response to an on-die termination information signal ODT_FLAG. The on-die termination information signal ODT_FLAG may be activated in response to an ODT command. A semiconductor memory device may include a termination circuit for interface pads, to perform a high-speed operation. The termination circuit may control the change or on/off of a termination resistance value using a pin (or a pad) referred to as 'ODT', to minimize jitter occurring in the interface terminal. A memory controller (not illustrated) may apply various commands for controlling the semiconductor memory device and the ODT command for controlling on/off of the termination circuit. The on-die termination Information signal ODT_FLAG may be activated while a termination operation is performed in response to the ODT command.

The clock control signal generation unit 230 may activate the clock control signal CLK_EN in response to a write information signal WT_FLAG, during a write operation period.

Furthermore, the clock control signal generation unit 230 may activate the clock control signal CLK_EN in response to a read information signal RD_FLAG, during a read operation period.

The output clock control unit 240 may receive the delay locked clock ICLKOUT, and generate a final delay locked clock DLLCLKI in response to the clock control signal CLK_EN by limit the toggling of the delay locked clock ICLKOUT. Only when the clock control signal CLK_EN is activated, the output clock control unit 240 may be driven to output the delay locked clock ICLKOUT as the final delay locked clock DLLCLKI.

The clock dividing unit 210 receiving the external clock CLK may generate the internal clock ICLK, and output the generated internal clock ICLK to the delay line unit 221. When the delay line unit 221 is initially driven, the delay line unit 221 may bypass the internal clock ICLK outputted from the clock dividing unit 210. The replica delay unit 223 may delay the delay locked clock ICLKOUT outputted from the delay line unit 221 by a modeled time, and output the delayed clock as the feedback clock FBCLK. The phase comparison unit 225 may compare the phase of the internal clock ICLK to the phase of the feedback clock FBCLK outputted from the replica delay unit 223. The delay control unit 227 may generate the delay control signal CTRL in response to the comparison result UP/DN outputted from the phase comparison unit 225, and output the generated delay control signal CTRL to the delay line unit 221. Thus, the delay line unit 221 may delay the internal clock ICLK by a predetermined delay time in response to the delay control signal CTRL, and output the delayed clock as the delay locked clock ICLKOUT.

The clock delay unit 220 may repeat such a series of operations. When the phase of the internal clock ICLK is synchronized with the phase of the feedback clock FBCLK as the comparison result of the phase comparison unit 225, the delay time of the delay line unit 221 may be locked to output the delay locked clock ICLKOUT. The clock control signal generation unit 230 may receive the DCC information signal DCC_FLAG and generate the clock control signal CLK_EN. During a DCC operation period in which the clock control signal CLK_EN is activated, the output clock control unit 240 may output the delay locked clock ICLKOUT locked through the delay line unit 221 as the final delay locked clock DLLCLKI. Then, as the DCC information signal DCC_FLAG is deactivated, the clock control signal CLK_EN may be deactivated to block the operation of the output clock control unit 240. Thus, the output of the delay locked clock ICLKOUT outputted from the delay line unit 221 may be blocked. After the DCC operation, the semiconductor memory device may be ready to receive a command for an internal operation from the memory controller (not illustrated).

The clock control signal generation unit 230 may receive the ODT command from the memory controller, and generate the clock control signal CLK_EN in response to the ODT information signal ODT_FLAG indicating an ODT operation period. Thus, the output clock control unit 240 may output the delay locked clock ICLKOUT locked through the delay line unit 221 as the final delay locked clock DLLCLKI, in response to the clock control signal CLK_EN. Then, as the ODT information signal is deactivated, the clock control signal CLK_EN may be deactivated to block the operation of the output clock control unit 240.

Then, the clock control signal generation unit 230 may generate the clock control signal CLK_EN in response to the write information signal WT_FLAG indicating a write operation period in response to a write command. Thus, the output clock control unit 240 may output the delay locked clock ICLKOUT locked by the delay line unit 221 as the final delay locked clock DLLCLKI, in response to the clock control signal CLK_EN. Then, as the write information signal WT_FLAG is deactivated, the clock control signal CLK_EN may be deactivated, and the driving of the output clock control unit 240 may be blocked.

Then, the clock control signal generation unit 230 may generate the clock control signal CLK_EN in response to the read information signal RD_FLAG indicating a read operation period in response to a read command. Thus, the output clock control unit 240 may output the delay locked clock ICLKOUT locked through the delay line unit 221 in response to the clock control signal CLK_EN. Then, as the read information signal RD_FLAG is deactivated, the clock control signal CLK_EN may be deactivated to block the operation of the output clock control unit 240.

Thus, the DLL circuit in accordance with an embodiment of the present invention may output the delay locked clock ICLKOUT locked through the clock delay unit 220 when the semiconductor memory device internally requires a delay locked clock. Thus, the output of the delay locked clock may be controlled to reduce unnecessary current consumption of the DLL circuit.

Figure 3:
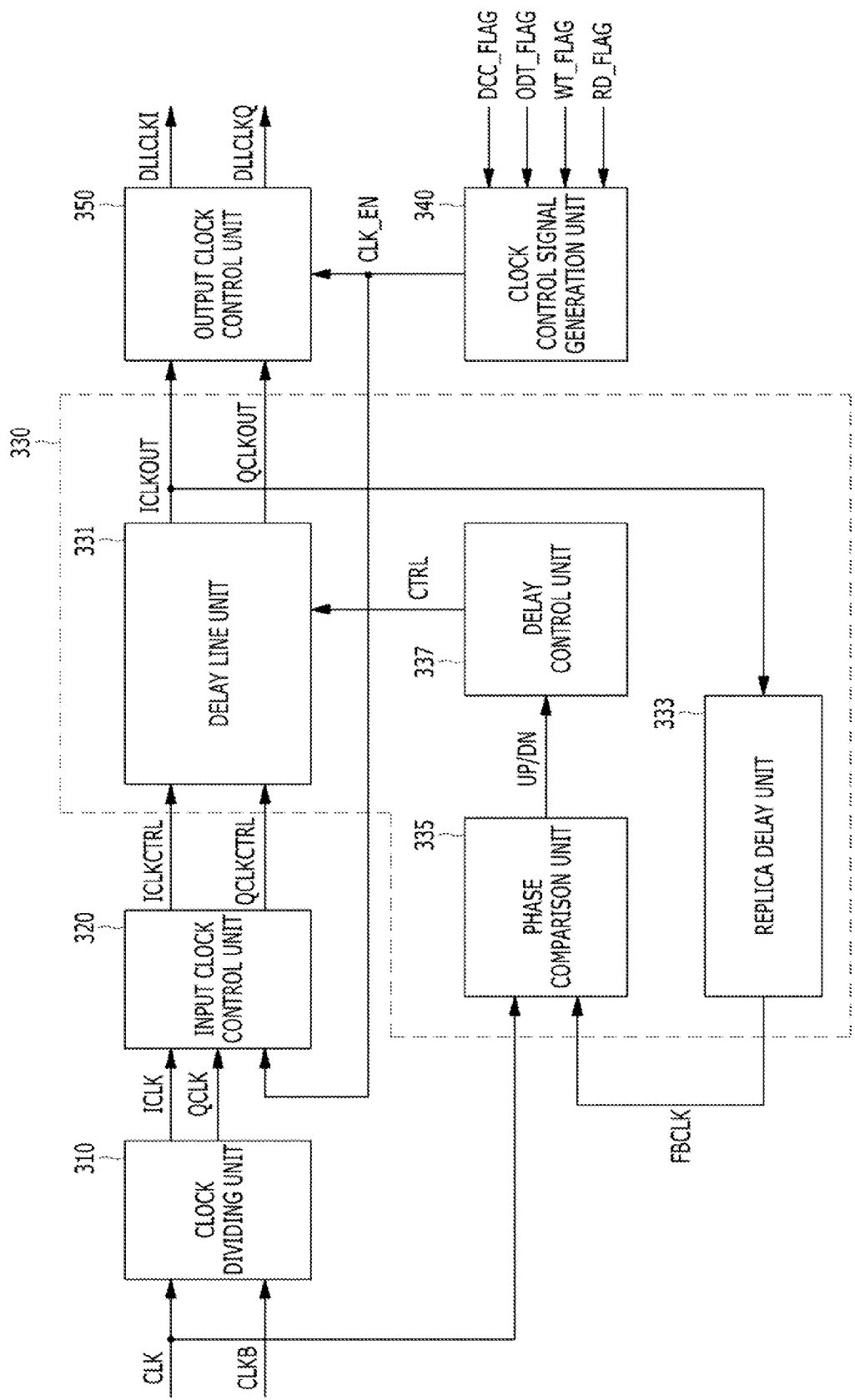
FIG. 3 is a block diagram illustrating a DLL circuit in accordance with an embodiment of the present invention.

FIG. 3 is a block diagram illustrating a DLL circuit in accordance with an embodiment of the present invention.

Referring to FIG. 3, the DLL circuit may include a clock dividing unit 310, an input clock control unit 320, a clock delay unit 330, a clock control signal generation unit 340, and an output clock control unit 350.

The clock dividing unit 310 may receive external differential clocks CLK and CLKB. The clock dividing unit 310 may generate first and second internal clocks ICLK and QCLK by dividing the external differential clocks CLK and CLKB.

The input clock control unit 320 may receive the first and second internal clocks ICLK and QCLK from the clock dividing unit 310, and receive a clock control signal CLK_EN from the clock control signal generation unit 340. The input clock control unit 320 may transmit the first internal clock ICLK to the delay line unit 331 as a first controlled internal clock ICLKCTRL, and transmit the second internal clock QCLK to the delay line unit 331 in response to the clock control signal CLK_EN as second controlled internal clock QCLKCTRL. In other words, the input clock control unit 320 may control the output of the second internal clock QCLK in response to the clock control signal CLK_EN.

The clock delay unit 330 may include a delay line unit 331, a replica delay unit 333, a phase comparison unit 335, and a delay control unit 337.

The delay line unit 331 may output first and second delay locked clocks ICLKOUT and QCLKOUT by delaying the first and second controlled internal clocks ICLKCTRL and QCLKCTRL by a predetermined delay time in response to a delay control signal CTRL received from the delay control unit 337.

The replica delay unit 333 may reflect an actual delay of a clock path and a data path into the first delay locked clock ICLKOUT outputted from the delay line unit 331, and output a feedback clock FBCLK. The replica delay unit 333 may output the feedback clock FBCLK to the phase comparison unit 335.

The phase comparison unit 335 may compare the phase of the external clock CLK of the external differential clocks CLK and CLKB to the phase of the feedback clock FBCLK outputted from the replica delay unit 333.

The delay control unit 337 may generate the delay control signal CTRL in response to a comparison signal UP/DN outputted from the phase comparison unit 335.

The clock control signal generation unit 340 may receive a DCC information signal DCC_FLAG, an on-die termination information signal ODT_FLAG, a write information signal WT_FLAG, and a read information signal RD_FLAG.

The DCC information signal DCC_FLAG may be activated when a DCC operation is to be performed, and deactivated when the DCC operation is ended. That is, the DCC information signal DCC_FLAG may indicate a DCC operation period.

The on-die termination information signal ODT_FLAG may be activated in response to an ODT command. A memory controller (not illustrated) may apply various commands for controlling the semiconductor memory device and the ODT command for controlling turn-on/off of a termination circuit of the semiconductor memory device to the semiconductor memory device. The on-die termination information signal ODT_FLAG may be activated while a termination operation is performed in response to the ODT command.

The write information signal WT_FLAG may be activated while a write operation is performed from the time when a write command is applied from the memory controller.

The read information signal RD_FLAG may be activated while a read operation is performed from the time when a read command is applied from the memory controller.

The on-die termination information signal ODT_FLAG, the write information signal WT_FLAG, the read information signal RD_FLAG, and the DCC information signal DCC_FLAG may indicate when a delay locked clock is required inside the semiconductor memory device. The clock control signal generation unit 340 may generate the clock control signal CLK_EN when a delay locked clock is required inside the semiconductor memory device.

The output clock control unit 350 may control the output of the first and second delay locked clocks ICLKOUT and QCLKOUT outputted from the delay line unit 331, in response to the clock control signal CLK_EN. While the clock control signal CLK_EN is activated, the output clock control unit 350 may enable the toggling of the first and second delay locked clocks ICLKOUT and QCLKOUT.

The clock dividing unit 310 receiving the external differential clocks CLK and CLKB may generate the first and second internal clocks ICLK and QCLK. The clock dividing unit 310 may output the generated first and second internal clocks ICLK and QCLK to the input clock control unit 320.

For example, the clock control signal generation unit 340 may generate the deactivated clock control signal CLK_EN because the DCC information signal DCC_FLAG, the on-die termination information signal ODT_FLAG, the write information signal WT_FLAG, and the read information signal RD_FLAG are not yet applied. Thus, the input clock control unit 320 may transmit the first internal clock ICLK to the delay line unit 331. However, as the clock control signal CLK_EN is deactivated, the input clock control unit 320 may block the path through which the second internal clock QCLK is transmitted to the delay line unit 331.

When the delay line unit 331 is initially driven, the delay line unit 331 may bypass the first and second internal clock ICLKCTRL and QCLKCTRL outputted from the input clock control unit 320. The replica delay unit 333 may delay the first delay locked clock ICLKOUT outputted from the delay line unit 331 by a modeled time, and output the delayed clock as the feedback clock FBCLK. The phase comparison unit 335 may compare the phase of the external clock CLK to the phase of the feedback clock FBCLK outputted from the replica delay unit 333. The delay control unit 337 may generate the delay control signal CTRL in response to the comparison result UP/DN outputted from the phase comparison unit 335, and output the generated delay control signal CTRL to the delay line unit 331. Thus, the delay line unit 331 may delay the first internal clock ICLK by a predetermined delay time in response to the delay control signal CTRL, and output the delayed clock as the first delay locked clock ICLKOUT.

The clock delay unit 330 may repeat such a series of loop operations. When the phase of the internal clock ICLK is synchronized with the phase of the feedback clock FBCLK as the comparison result of the phase comparison unit 335, the delay time of the delay line unit 331 may be locked to output the first delay locked clock ICLKOUT.

As the clock control signal CLK_EN generated from the clock control signal generation unit 340 is deactivated, the output clock control unit 350 may be disabled. Thus, the output clock control unit 350 may block the output of the first delay locked clock ICLKOUT outputted from the delay line unit 331, based on the deactivated clock control signal CLK_EN.

On the other hand, when receiving the DCC information signal DCC_FLAG indicating that a DCC operation is to be performed, the clock control signal generation unit 340 may generate the clock control signal CLK_EN.

As the clock control signal CLK_EN is activated, the input clock control unit 320 may transmit the second internal clock QCLK to the delay line unit 331. The delay line unit 331 may receive the first and second internal clocks ICLK and QCLK, and output the first and second delay locked clocks ICLKOUT and QCLKOUT in response to the delay control signal CTRL. While the clock control signal CLK_EN is activated, the output clock control unit 350 may output the first and second delay locked clocks ICLKOUT and QCLKOUT locked through the delay line unit 331 as the first and second final delay locked clocks DLLCLKI and DLLCLKQ.

When the DCC operation is completed, the DCC information signal DCC_FLAG may be deactivated. Then, the clock control signal CLK_EN may be deactivated to block the transmission path of the second internal clock QCLK from the input clock control unit 320 to the delay line unit 331 and the operation of the output clock control unit 350. Thus, the transmission of the second internal clock QCLK from the input clock control unit 320 to the delay line unit 331 may be blocked, and the output of the second delay locked clock QCLKOUT outputted from the delay line unit 331 may be blocked.

After the DCC operation, the semiconductor memory device may be ready to receive a command for an internal operation of the semiconductor memory device from the memory controller.

The clock control signal generation unit 340 may receive the ODT command, and generate the clock control signal CLK_EN in response to the ODT information signal ODT_FLAG indicating an ODT operation period. Thus, the input clock control unit 320 may transmit the second internal clock QCLK to the delay line unit 331 in response to the clock control signal CLK_EN. The output clock control unit 350 may output the first and second delay locked clocks ICLKOUT and QCLKOUT locked through the delay line unit 331. Then, as the ODT information signal ODT_FLAG is deactivated, the clock control signal CLK_EN may be deactivated to block the transmission path of the second internal clock QCLK from the input clock control unit 320 to the delay line unit 331 and the operation of the output clock control unit 350.

Then, the clock control signal generation unit 340 may receive a write command, and generate the clock control signal CLK_EN in response to the write information signal WT_FLAG indicating a write operation period. Thus, the input clock control unit 320 may transmit the second internal clock QCLK to the delay line unit 331 in response to the clock control signal CLK_EN. The output clock control unit 350 may output the first and second delay locked clocks ICLKOUT and QCLKOUT locked through the delay line unit 331. Then, as the write information signal WT_FLAG is deactivated, the clock control signal CLK_EN may be deactivated to block the transmission path of the second internal clock QCLK from the input clock control unit 320 to the delay line unit 331 and the operation of the output clock control unit 350.

Then, the clock control signal generation unit 340 may a read command, and generate the clock control signal CLK_EN in response to the read information signal RD_FLAG indicating a read operation period. Thus, the input clock control unit 320 may transmit the second internal clock QCLK to the delay line unit 331 in response to the clock control signal CLK_EN. The output clock control unit 350 may output the first and second delay locked clocks ICLKOUT and QCLKOUT locked through the delay line unit 331. Then, as the read information signal RD_FLAG is deactivated, the clock control signal CLK_EN may be deactivated to block the transmission path of the second internal clock QCLK from the input clock control unit 320 to the delay line unit 331 and the operation of the output clock control unit 350.

Thus, the first internal clock ICLK corresponding to a source signal for performing a DLL operation in the DLL circuit in accordance with an embodiment of the present invention may be used during an update operation of the DLL circuit. On the other hand, the second internal clock QCLK may not be used during an update operation of the DLL circuit. However, the DLL circuit may require the second internal clock QCLK because the second final delay locked clock DLLCLKQ is used during the DCC operation. The DLL circuit may control the second internal clock QCLK not to be transmitted to the clock delay unit 330, using the clock control signal CLK_EN, during a period in which a delay locked clock is not required. Thus, the DLL circuit may control the second internal clock QCLK which is not used during an update operation of the DLL circuit, thereby reducing unnecessary power consumption of the DLL circuit.

Furthermore, the DLL circuit may output the first and second delay locked clocks ICLKOUT and QCLKOUT locked through the clock delay unit 330 when a delay locked clock is required. Thus, unnecessary current consumption of the DLL circuit may be reduced.

Figure 4:
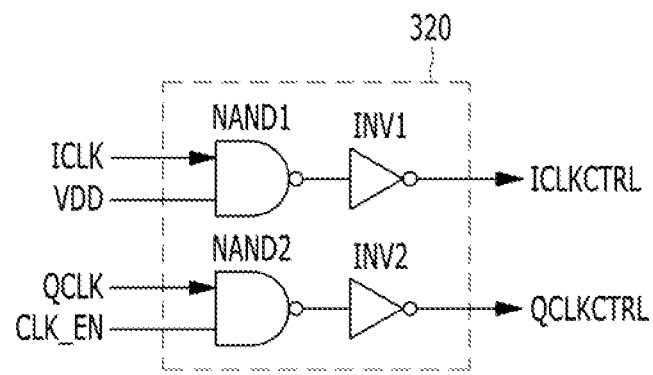
FIG. 4 is a detailed diagram of an input clock control unit shown in FIG. 3.

FIG. 4 is a detailed diagram of the input clock control unit 320 shown in FIG. 3.

Referring to FIG. 4, the input clock control unit 320 may include a first NAND gate NAND1 and a second NAND gate NAND2. The first NAND gate NAND1 may receive the first internal clock ICLK and a power supply voltage VDD, and the second NAND gate NAND2 may receive the second internal clock QCLK and the clock control signal CLK_EN. The input clock control unit 320 may include inverters INV1 and INV2 to invert signals outputted from the first and second NAND gates NAND1 and NAND2, respectively.

The first NAND gate NAND1 may pass the first internal clock ICLK due to the power supply voltage VDD. The clock passing through the first NAND gate NAND1 may be outputted through the inverter INV1 as the first controlled internal clock ICLK.

The second NAND gate NAND2 may pass the second internal clock ICLK according to the clock control signal CLK_EN. In other words, the second NAND gate NAND2 may transfer the second internal clock QCLK when the clock control signal CLK_EN is activated at a high level. The clock passing through the second NAND gate NAND2 may be outputted through the inverter INV2 as the second controlled internal clock QCLKCTRL.

The input clock control unit 320 may enable the toggling of the second internal clock QCLK only when a delay locked clock is required, in response to the clock control signal CLK_EN. The first internal clock ICLK may be used as a source signal for performing a DLL operation, during an update operation of the DLL circuit. On the other hand, since the second internal clock QCLK is not used during an update operation of the DLL circuit, toggling of the second internal clock QCLK may be prevented through the clock control signal CLK_EN when a delay locked clock is not required. Thus, unnecessary current consumption may be reduced.

Figure 5:
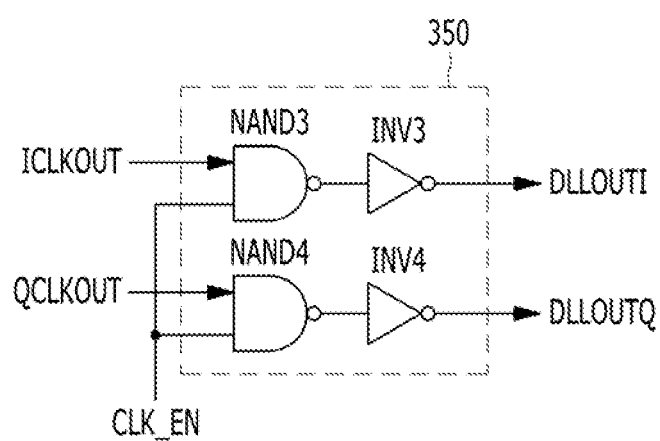
FIG. 5 is a detailed diagram of an output clock control unit shown in FIG. 3.

FIG. 5 is a detailed diagram of the output clock control unit 350 shown in FIG. 3.

Referring to FIG. 5, the output clock control unit 350 may include a first NAND gate NAND3 and a second NAND gate NAND4.

The first NAND gate NAND3 may receive the first delay locked clock ICLKOUT and the clock control signal CLK_EN, and the second NAND gate NAND4 may receive the second delay locked clock QCLKOUT and the clock control signal CLK_EN. The output clock control unit 350 may include inverters INV3 and INV4 to invert signals outputted from the first and second NAND gates NAND3 and NAND4, respectively.

The first NAND gate NAND3 may output the first delay locked clock ICLKOUT in response to the clock control signal CLK_EN. That is, the first NAND gate NAND3 may output the first delay locked clock ICLKOUT when the clock control signal CLK_EN is at a high level. The signal outputted from the first NAND gate NAND3 may be inverted through the inverter INV3 and outputted as the first final delay locked clock DLLOUTI.

The second NAND gate NAND4 may output the second delay locked clock QCLKOUT in response to the clock control signal CLK_EN. That is, the second NAND gate NAND4 may output the second delay locked clock QCLKOUT when the clock control signal CLK_EN is at a high level. The signal outputted from the second NAND gate NAND4 may be inverted through the inverter INV4 and outputted as the second final delay locked clock DLLOUTQ.

Thus, the output clock control unit 350 may control the output of the first and second delay locked clocks ICLKOUT and QCLKOUT in response to the clock control signal CLK_EN. In other words, the output clock control unit 350 may output the first and second delay locked clocks ICLKOUT and QCLKOUT only when a delay locked clock is required. Thus, the output clock control unit 350 may prevent a delay locked clock from being toggled during a period in which a delay locked clock is not required, thereby reducing unnecessary current consumption.

Figure 6:
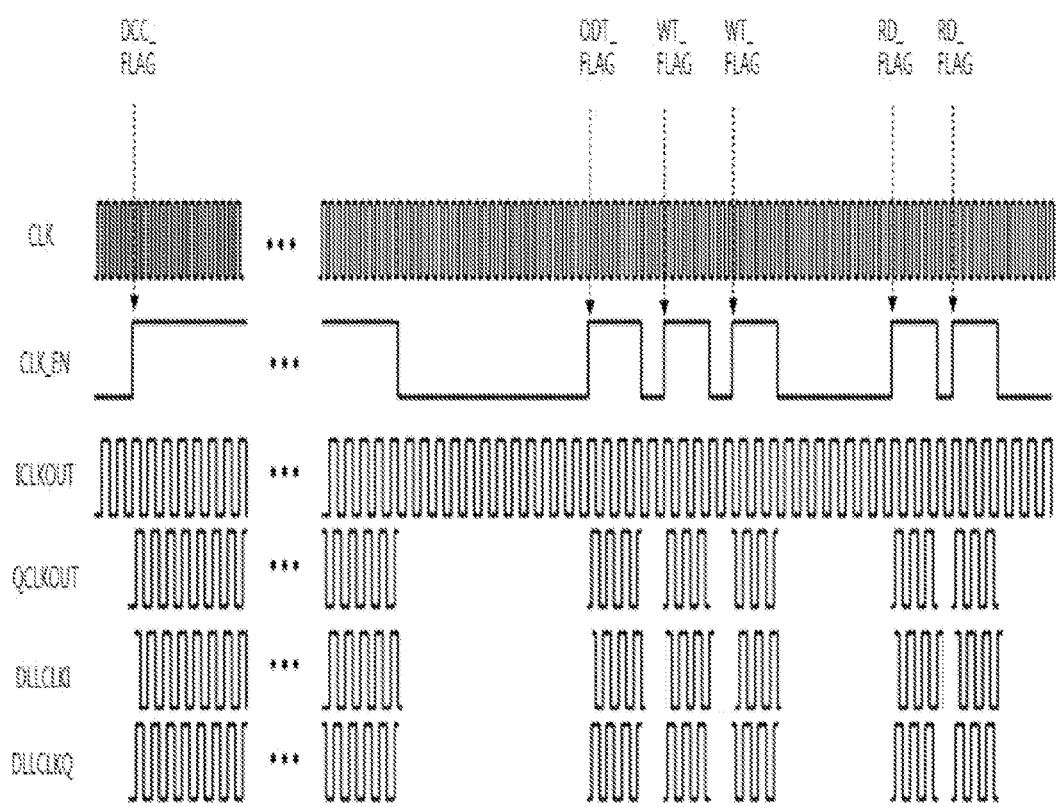
FIG. 6 is a timing diagram for describing an operation of the DLL circuit shown in FIG. 3.

FIG. 6 is a timing diagram for describing an operation of the DLL circuit shown in FIG. 3.

Referring to FIG. 6, the DLL circuit may receive the external clock CLK to generate the first and second internal clocks ICLK and QCLK, and perform a DLL operation to generate the first and second delay locked clocks ICLKOUT and QCLKOUT. The DLL circuit in accordance with an embodiment of the present invention may output the first and second delay locked clocks ICLKOUT and QCLKOUT as the clock control signal CLK_EN is activated during the DCC operation period.

In other words, the DLL circuit may internally control toggling of the second delay locked clock QCLKOUT by using the clock control signal CLK_EN, during the DCC operation period. After the DCC operation, the clock control signal CLK_EN may be activated to control toggling of the second delay locked clock QCLKOUT, according to the ODT operation period, the write operation period, and the read operation period.

Furthermore, since the first and second delay locked clocks ICLKOUT and QCLKOUT are outputted as the first and second final delay locked clocks DLLCLKI and DLLCLKQ only during the DCC operation period, the ODT operation period, the write operation period, or the read operation period in which the first and second delay locked clocks ICLKOUT and QCLKOUT are finally used, current consumption of the DLL circuit may be reduced.

In accordance with the embodiments of the present invention, a delay locked loop may be controlled to output a delay locked clock only when the delay locked clock is needed, thereby reducing unnecessary current consumption.

Although various embodiments have been described for illustrative purposes, it will be apparent to those skilled in the art that various changes and modifications may be made without departing from the spirit and scope of the invention as defined in the following claims.

For example, the positions and types of the logic gates and transistors included in the above-described embodiments may be implemented in a different manner depending on the polarity of an input signal.

What is claimed is:

1. A delay locked loop (DLL) circuit comprising:
   a clock dividing unit configured to generate first and second internal clocks by dividing the external clock;
   an input clock control unit configured to generate first and second controlled internal clocks by controlling transmission of the first and second internal clocks based on a clock control signal which is activated during a predetermined period;
   a clock delay unit configured to generate a first delay locked clock by delaying the first internal clock by a delayed time required for locking and generate a second delay locked clock by delaying the second internal clock; and
   an output clock control unit configured to output the first delay locked clock and the second delay locked clock during a period in which the clock control signal is activated,
   wherein the clock delay unit comprises:
      a delay line unit configured to generate the first and second delay locked clocks by delaying the first and second internal clocks by the delay time according to a delay control signal;
      a replica delay unit configured to generate a feedback clock by delaying the first delay locked clock by a modeled delay amount for an internal path;
      a phase comparison unit configured to compare the phase of the feedback clock to the phase of the external clock; and
      a delay control unit configured to generate the delay control signal according to a comparison result of the phase comparison unit.

2. The DLL circuit of claim 1, further comprising a clock control signal generation unit configured to generate the clock control signal, which is activated during a duty cycle correction (DCC) operation period.

3. The DLL circuit of claim 1, further comprising a clock control signal generation configured to generate the clock control signal, which is activated during a normal operation period.

4. The DLL circuit of claim 3, wherein the normal operation period includes an on-die terminal operation, a write operation, or a read operation.

5. An operating method of a DLL circuit, comprising:
   generating first and second internal clocks by dividing an external clock;
   generating a first delay locked clock by delaying the first internal clock by a delay time required for synchronizing the phase of the first internal clock with the phase of a feedback clock based on a delay control signal;
   generating a second delay locked clock by delaying the second internal clock by the delay time during a DCC operation period and a normal operation period based on the delay control signal;
   generating a feedback clock by delaying the first delay locked clock by a modeled delay amount for an internal path; and
   outputting the first and second delay locked clocks based on a clock control signal which is activated during the DCC operation period and the normal operation period,
   wherein the delay control signal is generated based on the comparison of the phase of the feedback clock and the phase of the external clock.

6. The operating method of claim 5, wherein the normal operating period includes an on-die termination operation, a write operation, or a read operation.

7. A DLL circuit comprising:
   a clock dividing unit configured to generate an internal clock by dividing an external clock;
   a clock delay unit configured to generate a delay locked clock by delaying the internal clock;
   a clock control signal generation unit configured to generate a clock control signal for controlling operation of the clock delay unit during a predetermined period;
   an output clock control unit configured to output the delay locked clock based on the clock control signal; and
   wherein the clock delay unit comprises:
      a delay line unit configured to generate the first and second delay locked clocks by delaying the first and second internal clocks by the delay time according to a delay control signal;

a replica delay unit configured to generate a feedback clock by delaying the first delay locked clock by a modeled delay amount for an internal path;

a phase comparison unit configured to compare the phase of the feedback clock to the phase of the external clock; and a delay control unit configured to generate the delay control signal according to a comparison result of the phase comparison unit.

8. The DLL circuit of claim 7, wherein the clock control signal is activated during a DCC operation period.

9. The DLL circuit of claim 7, wherein the clock control signal is activated during a normal operation period.

10. The DLL circuit of claim 9, wherein the normal operation period includes an on-die termination operation, a write operation, or a read operation.

* * * * *